(12) United States Patent
Krainer

(10) Patent No.: US 9,664,178 B2
(45) Date of Patent: May 30, 2017

(54) CIRCUITS, SYSTEMS AND METHODS FOR INTEGRATING SENSING AND HEATING FUNCTIONS

(71) Applicant: Infineon Technologies Austria AG, Villach (AT)

(72) Inventor: Siegfried Krainer, Villach (AT)

(73) Assignee: Infineon Technologies Austria AG, Villach (AT)

(*) Notice: Subject to any disclaimer, the term of this patent is extended or adjusted under 35 U.S.C. 154(b) by 818 days.

(21) Appl. No.: 14/023,094

(22) Filed: Sep. 10, 2013

(65) Prior Publication Data

US 2014/0072429 A1   Mar. 13, 2014

Related U.S. Application Data

(60) Provisional application No. 61/699,547, filed on Sep. 11, 2012.

(51) Int. Cl.
*F01P 7/06* (2006.01)
*F03D 11/00* (2006.01)
(Continued)

(52) U.S. Cl.
CPC ......... *F03D 11/0025* (2013.01); *F03D 80/40* (2016.05); *H01L 23/345* (2013.01); *H01L 2924/0002* (2013.01); *Y02E 10/72* (2013.01)

(58) Field of Classification Search
CPC ... F04D 29/368; F04D 29/362; F03D 11/0025
(Continued)

(56) References Cited

U.S. PATENT DOCUMENTS

| 5,206,806 A | * | 4/1993 | Gerardi | B64D 15/16 244/134 F |
| 5,551,288 A | * | 9/1996 | Geraldi | B64D 15/20 324/671 |

(Continued)

FOREIGN PATENT DOCUMENTS

| CN | 1332684 A | 1/2002 |
| CN | 1707262 A | 12/2005 |

(Continued)

OTHER PUBLICATIONS

Villinger Research and Development, "Advanced Aircraft Ice Protection", 12 pages, as available at http://www.villinger.com/userfiles/image/iceprotection.pdf on Sep. 10, 2013.

(Continued)

*Primary Examiner* — Eric Keasel
*Assistant Examiner* — Jason Mikus
(74) *Attorney, Agent, or Firm* — Schiff Hardin LLP

(57) ABSTRACT

Embodiments relate to integrated circuits, systems and methods for combined sensing and heating functions in structures suitable for use in deicing, heating and other applications. In an embodiment, an integrated circuit is coupled to a heating element and configured to control operation of the heating element to provide heat as well as to utilize the heating element as at least part of a sensing structure to sense the presence of ice, water or air on or near the heating element. In embodiments, the heating element comprises a conductive polymer structure, and the presence of ice, water or air is sensed based on a capacitance, impedance or other spectroscopy of the structure sensed and analyzed by integrated circuitry coupled to the structure.

18 Claims, 9 Drawing Sheets

(51) Int. Cl.
*H01L 23/34* (2006.01)
*F03D 80/40* (2016.01)

(58) Field of Classification Search
USPC .......................................................... 416/39
See application file for complete search history.

(56) References Cited

U.S. PATENT DOCUMENTS

| 6,753,513 B2 | 6/2004 | Goldberg et al. |
| 2010/0096507 A1 | 4/2010 | Villinger |
| 2010/0206990 A1 | 8/2010 | Petrenko |

FOREIGN PATENT DOCUMENTS

| CN | 1727673 A | 2/2006 |
| CN | 201015510 Y | 2/2008 |
| CN | 101495373 A | 7/2009 |
| CN | 102242694 A | 11/2011 |
| CN | 102407942 A | 4/2012 |
| DE | 102006032387 A1 | 1/2008 |
| WO | WO-2012044213 A1 | 4/2012 |

OTHER PUBLICATIONS

Parent Olivier, et al., Elsevier: Cold Regions Science and Technology, "Anti-Icing and De-icing Techniques for Wind Turbines: Critical Review",© 2010, pp. 88-96.
Boreas VII, Summary of a Cold Climate Wind Energy Conference 2005, 28 pages, dated Nov. 2008.
Infineon Technologies AG, "Mobile Measurement Platform MD8710, One Device for Measurement and Medical Platform Development", 2 pages, © 2012.
Office Action dated Mar. 18, 2015 for German Patent Application No. 102013217774.7.
Office Action dated Apr. 10, 2015 for Chinese Patent Application No. 201310410976.1.
Office Action dated Apr. 12, 2016 for Chines Patent Application No. 201310410976.1.

* cited by examiner

CIRCUITS, SYSTEMS AND METHODS FOR INTEGRATING SENSING AND HEATING FUNCTIONS

RELATED APPLICATION

This application claims the benefit of U.S. Application No. 61/699,547 filed Sep. 11, 2012, which is incorporated herein by reference in its entirety.

TECHNICAL FIELD

Embodiments relate generally to integrated circuits, more particularly to integrated circuits and related systems and methods for integrating sensing and heating functions for, e.g., deicing.

BACKGROUND

Icing is a problem which affects the aviation and renewable energy generation industries, among others, and can occur on aircraft wings, propellers and other components as well as on the blades of wind turbines. Chemical and/or electrical deicing techniques are often used in the aviation industry, but there is no corresponding technique suitable for wind turbines given their size, fixed arrangement and tendency to ice non-uniformly because of the difference in wind speed at the tip versus the center of the blade. Thus, if icing is detected on the blades of a wind turbine, the turbine typically must be shut down, resulting in a loss of energy generation.

SUMMARY

Embodiments relate to integrated circuits and related systems and methods for integrating sensing and heating functions in structures for, e.g., deicing.

In an embodiment, a sensing and heating system comprises a first element and a second element; and circuitry coupled to the first and second elements and configured to receive a signal from at least one of the first or second elements related to a characteristic, to analyze the signal to detect a condition, and to activate at least one of the first and second elements to provide heat if the signal is indicative of the condition.

In an embodiment, a wind turbine comprises at least one sensing and heating system comprising a structure configured to sense a characteristic and provide heat; and circuitry coupled to the at least one sensing and heating system and configured to receive a signal related to the characteristic, to analyze the signal, and to provide heat in an area of the wind turbine proximate the sensed characteristic if the analyzing is indicative of a condition.

In an embodiment, an integrated circuit comprises driving circuitry configured to control a heating and sensing structure; and state machine circuitry coupled to the driving circuitry and configured to receive a signal from the heating and sensing structure, analyze the signal to determine a presence or absence of a condition proximate the heating and sensing structure, and control the driving circuitry based on the determined presence or absence of the condition.

In an embodiment, a method comprises sensing a characteristic by a sensing and heating structure; analyzing the characteristic to determine whether moisture is present at the sensing and heating structure; and activating the sensing and heating structure to provide heat if a result of the analyzing is a presence of moisture.

BRIEF DESCRIPTION OF THE DRAWINGS

The invention may be more completely understood in consideration of the following detailed description of various embodiments of the invention in connection with the accompanying drawings, in which.

Figure 1:
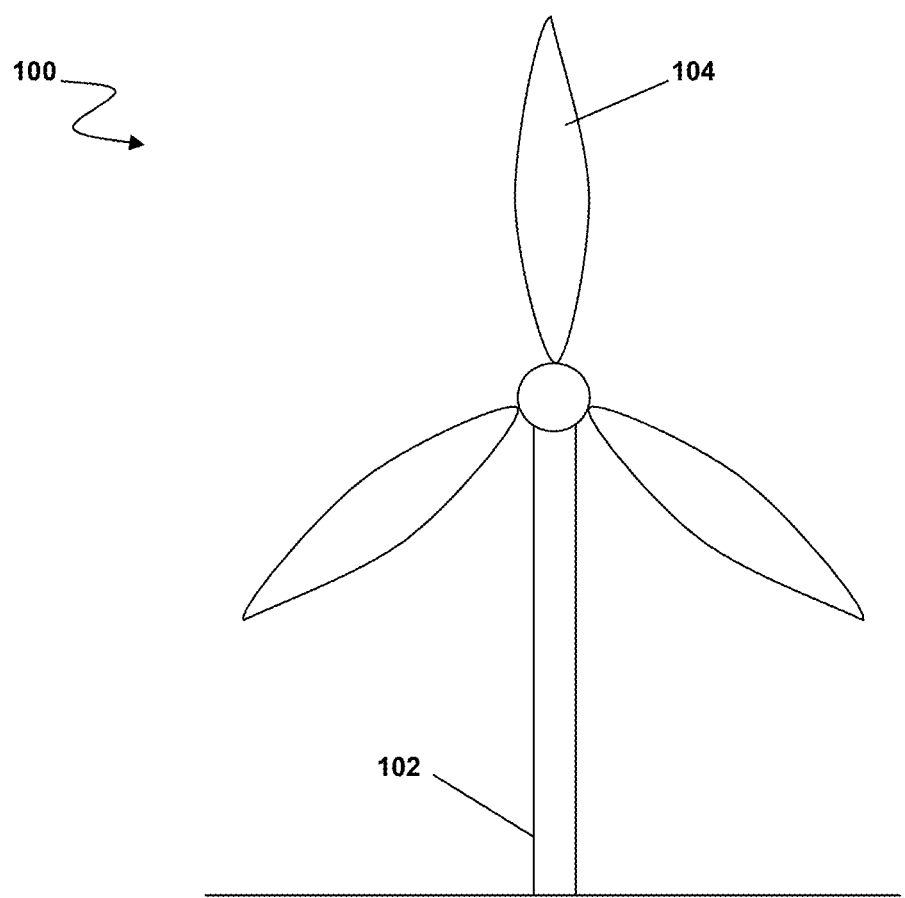
FIG. 1 is a diagram of a wind turbine according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated circuits, systems and methods for combined sensing and heating functions in structures suitable for use in deicing, heating and other applications. In an embodiment, an integrated circuit is coupled to a heating element and configured to control operation of the heating element to provide heat as well as to utilize the heating element as at least part of a sensing structure to sense the presence of ice, water or air on or near the heating element. In embodiments, the heating element comprises a conductive polymer structure, and the presence of ice, water or air is sensed based on a capacitance, impedance or other spectroscopy of the structure sensed and analyzed by integrated circuitry coupled to the structure.

Referring to FIG. 1, a wind turbine 100 is depicted. Turbine 100 is a horizontal-axis wind turbine (HAWT) and comprises a support column 102 and three blades 104, though the blade number and general configuration of turbine 100 can vary in embodiments. Though not depicted, embodiments are suitable for other types of wind turbines, including vertical-axis wind turbines (VAWT), which can comprise Darrieus, Savonius, twisted Savonius, parallel, Giromill and corkscrew, among others. Turbine 100 can also comprise a rotor, gear box, computer-controlled directional motors, a generator and brakes, and other components, which are not depicted in FIG. 1. In operation, blades 104 rotate in wind. In electrical power generation applications, the blades 104 are coupled to the generator by the rotor, and rotation of the blades causes power to be generated by the generator, converting wind energy into electricity for distribution and use.

Wind turbine 100 can be positioned alone or as part of a wind farm. In either situation, wind turbine 100 is typically located in an area of sufficiently high wind to consistently generate power. Such an area can also experience varying temperatures as well as humidity, rain, sleet, snow and other weather conditions conducive to the formation of ice on turbine 100, particularly on blades 104. Ice accretion on turbine 100 can cause many problems, including vibration and mass that can result in mechanical fatigue or failure, shedding of ice that can cause injuries or damage, and reduced or lost electrical energy generation due to lower performance or total shut-down because of inclement conditions.

In avionic, train/railroad and automotive applications, icing is often dealt with using chemical or electrical deicing techniques. For example, aircraft can be chemically deiced on the ground before flight and/or equipped with heating elements that can be manually switched on by an operator if icing is detected or conditions are suggestive thereof. Chemical deicing is also used on bridges, roadways and other structures on which vehicles travel. Simple mechanical techniques, such as scraping or plowing, also can be used. None of these techniques, however, are suitable for wind turbines. The size and configuration of wind turbines make chemical and mechanical techniques difficult if not impossible to use, while conventional electrical techniques add mass, energy demand, complexity and costs that are undesirable or untenable by manufacturers, owners and operators of wind turbines. Moreover, these techniques still require manual detection of icing conditions, making them impractical for remotely situated wind turbines. Conventional mechanical and/or electrical techniques also can be unsuitable, ineffective and/or inefficient for many automotive and train/railroad applications, including for radar systems and lighting. For example, many high-speed trains use radar systems for speed measurement, determination and monitoring, and these systems, in particular the radar domes, can be exposed to the elements, including wind and precipitation, and can be located in difficult-to-reach locations, making sensing of ice and deicing difficult using conventional techniques. In automobiles, external LED and other lighting elements can become iced, and often have no deicing systems beyond manual mechanical removal by a driver, operator or attendant.

Figure 2A:
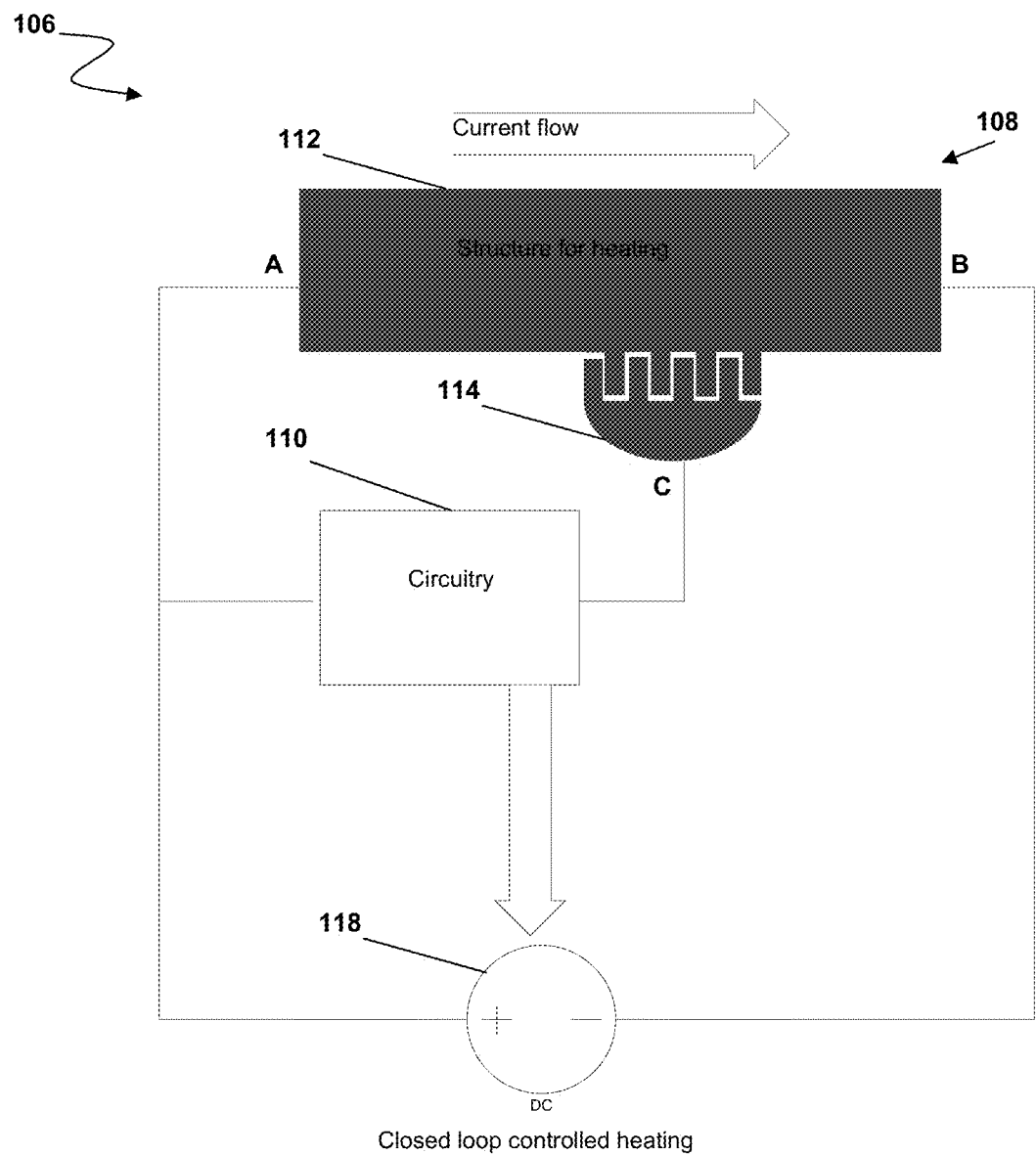
FIG. 2A is a block diagram of a sensing and heating system according to an embodiment.

In an embodiment, and referring to FIG. 2A, a deicing system 106 suitable for use with, e.g., wind turbines and other structures and devices comprises a sensing and heating portion 108 coupled with circuitry 110. Sensing and heating portion 108 comprises at least one heating structure 112 and at least one sensing structure 114 in an embodiment. In this and other embodiments, sensing and heating portion 108 can comprise a heating structure, such as structure 112, that comprises a current-conducting material, such as a resistive conductive polymer; a thin film; wire; coating or coated material; sputtered, printed or applied metal or composite, such as a metal film; or some other suitable conductive material in other embodiments that can be built in or on an area, surface or edge. Examples of suitable conductive polymers in embodiments are those available from VIL-LINGER RESEARCH AND DEVELOPMENT (www.villinger.com). The conductive polymer can be intrinsic or extrinsic and comprise a single layer or plurality of layers in embodiments.

Sensing and heating portion 108 also comprises at least one sensing structure 114, such as one which is or forms part of a capacitor, inductor or other suitable sensing structure along with heating portion 108. For example, in the embodiment of FIG. 2A, a portion of heating structure 112 and a portion of sensing structure 114 together form an interdigital capacitor. In other embodiments, sensing structure 114 can comprise a shape or structure other than one which is interdigital, or can be substituted with a resistive or an inductive structure or other structure suitable for enabling detection of ice and/or water thereon.

Figure 3:
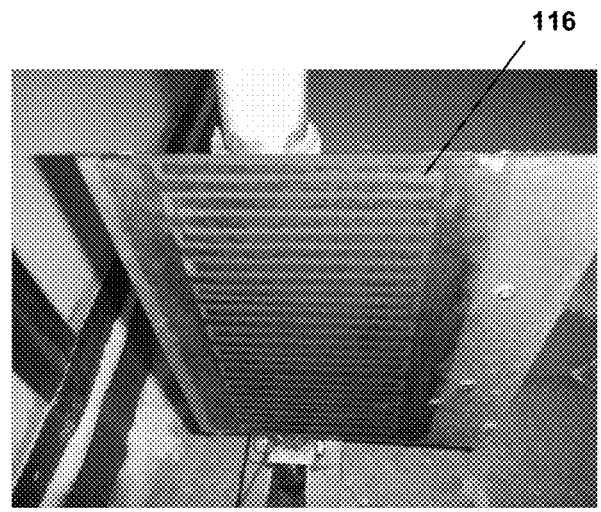
FIG. 3 is a depiction of a conductive polymer structure according to an embodiment.

For example, one suitable conductive polymer structure 116 used successfully in testing is depicted in FIG. 3, and it is this structure 116 that is one embodiment of a sensing structure 114 in an embodiment. Structure 116 is about 30 cm by about 30 cm in an embodiment, but the size and configuration can vary in other embodiments. For example, sensing and heating portion 108 can have dimensions of about 0.2 mm to about 1 mm by about 0.2 mm to about 1.0 mm in embodiments.

Circuitry 110 is coupled to sensing and heating portion 108. In an embodiment, sensing and heating structure 108 comprises three pins A, B and C. In FIG. 2A, pins A and B couple sensing and heating structure 112 to a power source 118, while pins A and C couple sensing and heating structure 112 to circuitry 110. In an embodiment, circuitry 100 comprises an integrated circuit and is adapted for signal processing and dielectric spectroscopy analysis of signals obtained from sensing and heating portion 108. In embodiments, circuitry 110 also comprises portions for providing a pulse wave modulated (PWM) output and a driver for switches to control the operation of sensing and heating portion 108 between sensing functions and heating functions. Therefore, circuitry 110 is also coupled to a power source 118, which provides closed-loop controlled power, controlled by circuitry 110, to sensing and heating portion 108.

Figure 2B:
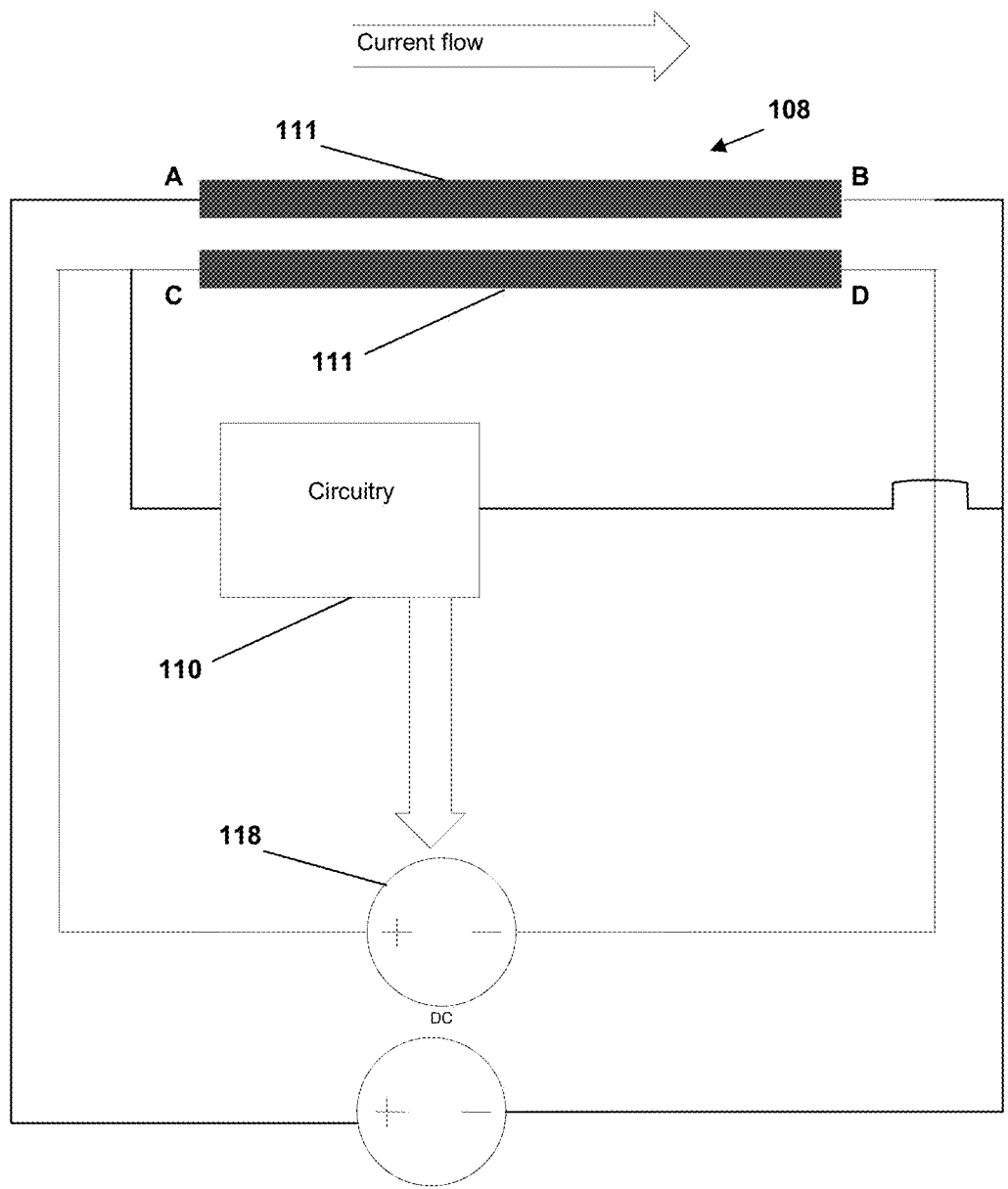
FIG. 2B is a block diagram of a sensing and heating system according to another embodiment.

Another embodiment is depicted in FIG. 2B, in which sensing and heating portion 108 comprises two elements 111 coupled in parallel. Elements 111 each can be heating elements and also can be used as a capacitor, with circuitry 110 sensing a capacitance between the two elements 111. As such, the same elements can be used for both heating and sensing. In another embodiment, only a first of elements 111 comprises a heating element, while a second is used in combination with the first for sensing. In yet another embodiment, more than two elements 111 are used. In an embodiment, a switch, short or other connection between two pins, such as pins A and C, or pins B and D, can be implemented to heat both elements 111, then the switch can be opened periodically to measure the capacitance of portion 108 to determine whether additional heating is necessary. For example, circuitry 110 can operate portion 108 with a duty cycle of 95% heating and 5% sensing in an embodiment, though these percentages are merely exemplary of one embodiment and can vary in others. When no water, icing or some other condition requiring heating has been sensed, heating can be omitted until a periodic sensing of capacitance of structure 108 indicates heating is necessary to remove ice or water or for some other reason. One or more of elements 111 can also comprises resistors in embodiments.

Figure 2C:
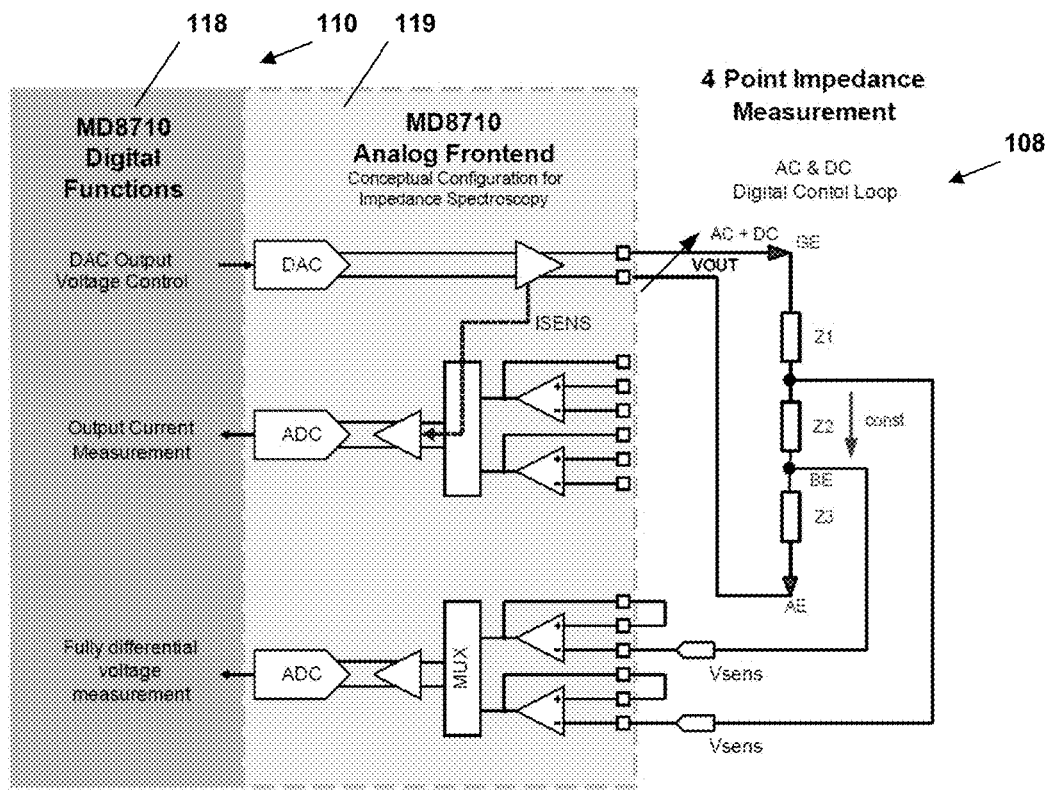
FIG. 2C is a block diagram of a sensing and heating system utilizing an MD8710 according to an embodiment.

Referring to FIG. 2C, circuitry 110 comprises an MD8710 available from INFINEON TECHNOLOGIES AG in one example embodiment. The MD8710 is an integrated data acquisition and processing microcontroller for medical, industrial and other applications, and can be suited to embodiments of system 106, though another microcontroller or circuitry can be used in other embodiments, the MD8710 being merely one non-limiting example. The MD8710 comprises a digital portion 118 and an analog frontend portion 119. Analog frontend portion 120 can be configured to carry out the spectral or other analysis from data received from sensing and heating portion 108, which in FIG. 2C comprises a conductive polymer or similar structure, as discussed herein, represented as an impedance at Z2. In other embodiments, impedance Z2 can instead be a capacitance, resistance or other characteristic. In the embodiment of FIG. 2C, a four-point connection between analog portion 119 and sensing and heating structure 108 is used, though this can vary in other embodiments (see, e.g., FIG. 2D). Output signals from analog frontend portion 120 can then be provided via digital portion 118, such as to a user interface, computer, server, dashboard or other device in embodiments. In the embodiment of FIG. 2B, Z1 and Z3 represent parasitic impedances in an experimental configuration. Depending upon the sizes of these parasitic impedances, it can also be possible in other embodiments to implement a simple two-wire measurement of Z2 as an alternative.

The embodiment of FIG. 2C is one example of one embodiment using an MD8710. Other configurations including the MD8710 can be implemented in other embodiments, and still further embodiments can replace the MD8710 in the configuration of FIG. 2C with another microcontroller, chip or circuitry, or use arrangements other than that depicted in FIG. 2C. In other words, FIG. 2C is but one experimental set-up associated with an embodiment that is not considered to be limiting with respect to other embodiments.

Figure 2D:
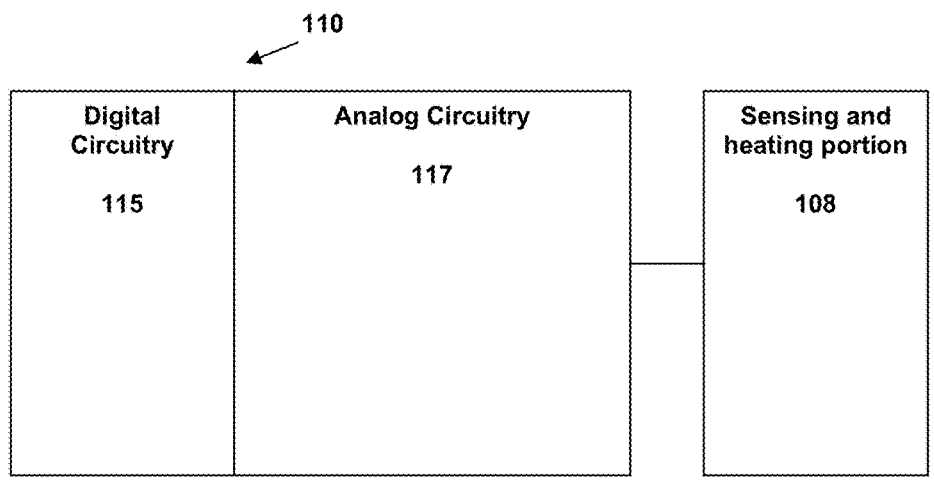
FIG. 2D is a block diagram of circuitry and a sensing and heating portion according to an embodiment.

For example, in FIG. 2D, a generalized depiction of FIG. 2C comprises digital circuitry 115, analog circuitry 117 and sensing and heating portion 108. Digital and analog circuitries 115 and 117 can be implemented in a single chip, such as an MD8710 or another chip, or can be separate in various embodiments. Depending upon the configuration of sensing and heating portion 108, the connections between sensing and heating portion 108 and analog circuitry 117 can vary. For example, a three-pin coupling as in FIG. 2A can be used, or a four-pin coupling as in either FIG. 2B or 2C, or some other connection such that sensing and heating portion 108, however configured, can interface with circuitry 110, such as circuitries 115 and 117, to provide heat and be used to sense whether heat should be applied based on a sensed capacitance, impedance, spectrum, phase angle or some other characteristic.

Figure 4A:
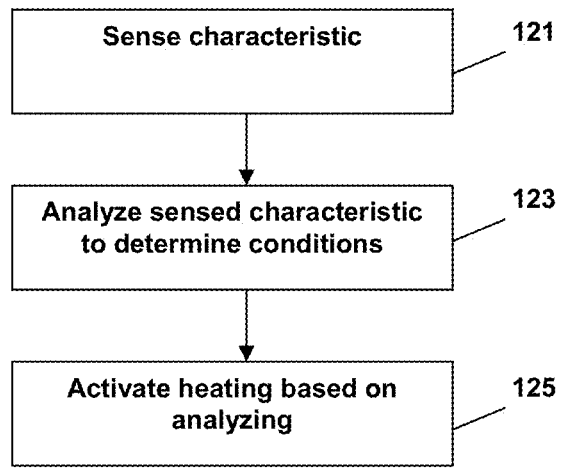
FIG. 4A is a flowchart of a method according to an embodiment.

In operation and referring to FIG. 4A, ice, water, moisture, humidity or other materials in, on or proximate to sensing and heating portion 108 will affect a capacitance, impedance or some other characteristic of sensing structure 114 such that circuitry 110 can sense a capacitance, impedance or change therein of structure 112 at 121 and analyze the sensed characteristic or other value by using dielectric spectroscopy, frequency or another suitable method to discriminate between ice, water, air or some other material at 123. Circuitry 110 can sample sensing and heating portion 108 at varying times and rates in embodiments to determine whether icing is occurring. In an embodiment, circuitry 110 can periodically obtain a measurement of the characteristic from sensing and heating portion 108 and then analyze that measurement according to dielectric spectroscopy, frequency or some other factor and conduct a comparison with respect to known capacitance, resistance or impedance values related to sensing and heating portion 108 to determine whether icing is occurring. If icing is occurring, or if water or some other condition is present and undesired, heating of sensing and heating portion 108 can be activated or cycled at 125.

Figure 4B:
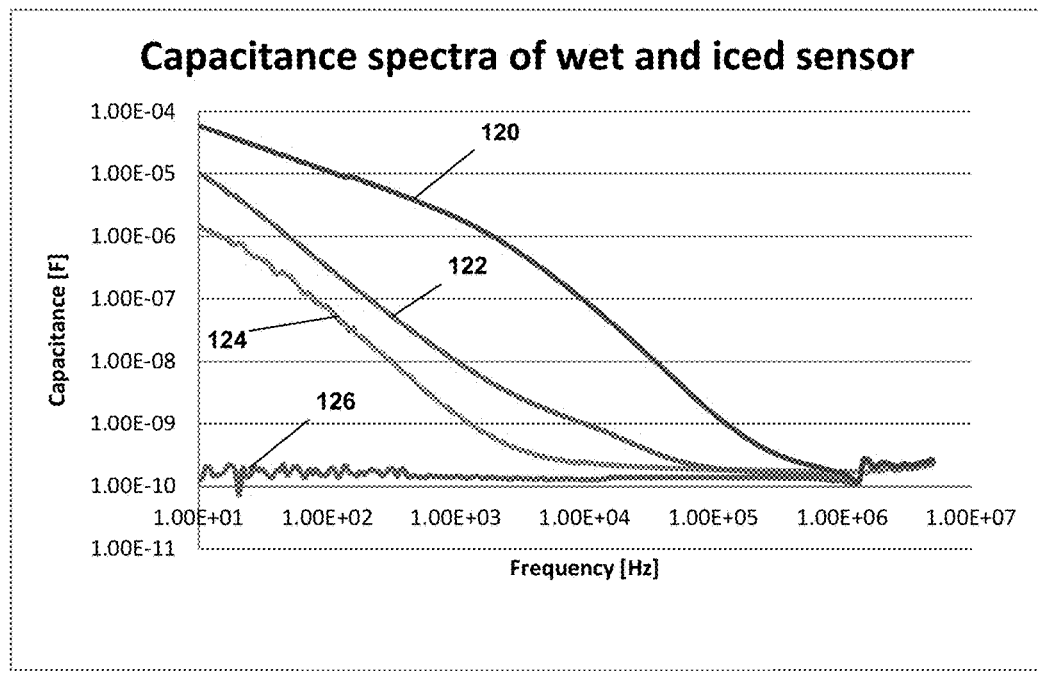
FIG. 4B is plot of capacitances versus frequency for air, water and two thicknesses of ice according to an embodiment.

For example, FIG. 4B depicts various capacitance spectra characteristics of different materials on sensing and heating portion 108. Line 120 represents water, line 122 represents a first thickness of ice, line 124 represents a second thickness of ice and line 126 represents air. Given the relatively low dielectric constant of air (about 1.0) versus the relatively higher dielectric constants of ice (3.2) and water (80.4), circuitry 110 can reliably discriminate between air (line 126) and water or ice (lines 120, 122, 124) by receiving a capacitance, impedance or other measurement from sensing and heating portion 108 and comparing that measurement to known values or ranges of values.

Figure 4C:
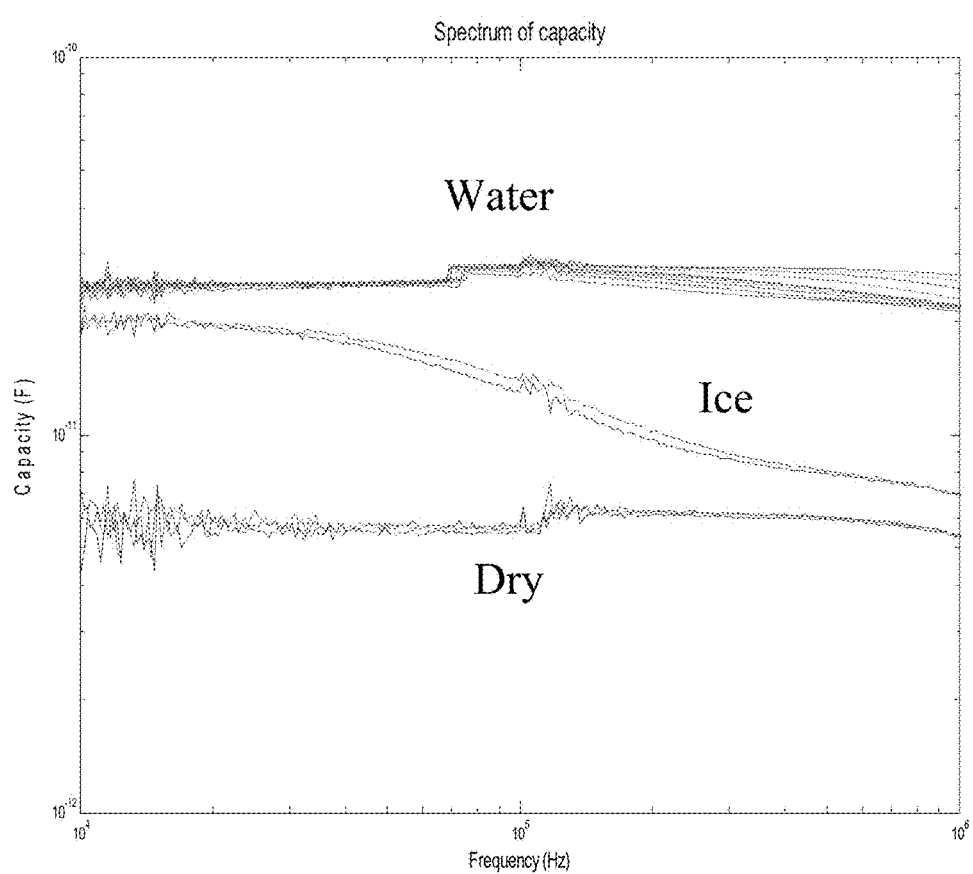
FIG. 4C is another plot of capacitances versus frequency for air, water and ice according to an embodiment.
Figure 4D:
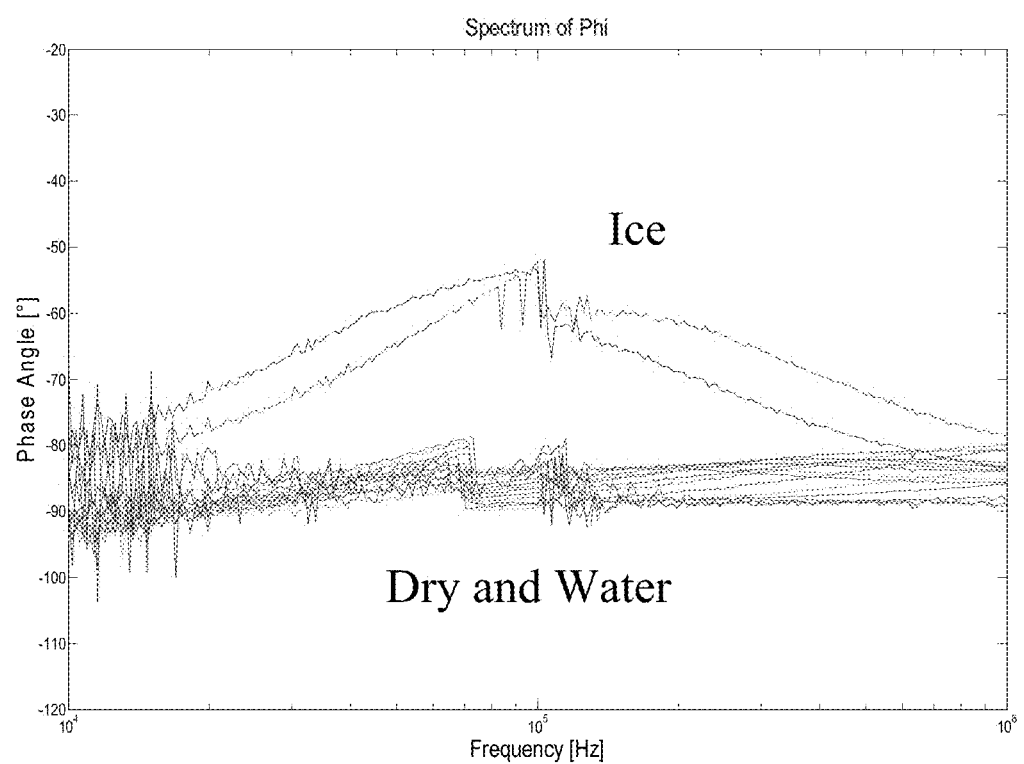
FIG. 4D is plot of phase angle versus frequency for air, water and ice according to an embodiment.

FIGS. 4C and 4D relate to experimental data of an embodiment. FIG. 4C is similar to FIG. 4B, a graphical depiction of capacitance, in Farads, versus frequency. Similar to FIG. 4B, water, ice and dry conditions can be distinguished based on the known dielectric constants of the materials of interest. In FIG. 4D, the phase angle in degrees is plotted with respect to frequency, and ice can again be distinguished from dry air or water. Other approaches for distinguishing the presence of air, ice or water in or on blades 104 can be used in other embodiments.

Figure 5:
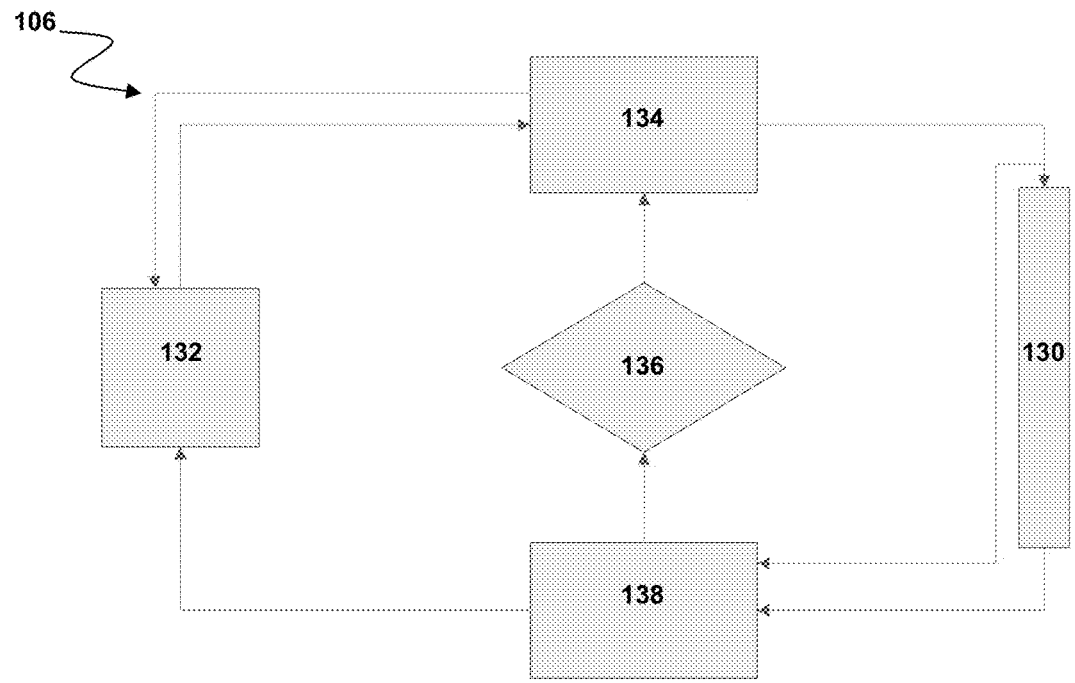
FIG. 5 is a functional block diagram of a sensing and heating system according to an embodiment.

Another depiction of system 106 is shown in FIG. 5 as a functional block diagram. In FIG. 5, system 106 comprises a heating element 130, a sensor element 132, a driving circuit 134 for the heating of heating element 130, a state machine 136 for the analysis of signals from sensor element 132 and the control of driving circuit 134 and an optional temperature measurement circuit 138. In embodiments, and as previously discussed, heating element 130 and sensor element 132 can comprise the same structure, or can overlap in structure, such that some or all of the same structure can be used for both sensing and heating. Regardless of the particular configuration of any one embodiment, and whether or not the same as, overlapping with or integral to sensor element 132, heating element 130 can comprise an extrinsic conductive polymer, an intrinsic conducting polymer, a resistive heating element or some other suitable current-conducting structure. Sensor element 132 is configured to sense changes in the electric polarizability, resistance, capacitance, impedance or some other characteristic due to the presence of ice, water or air. Driving circuit 134 is configured to drive heating element 130 and can comprise a linear regulator or some other switched method having pulse width modulation (PWM). Driving circuit 134 can also comprise topologies for regulated voltage conversion and other functions. State machine 136 is configured to analyze signals from sensor element 132 to determine whether ice, moisture, or air is present based on the sensed signal and to control driving circuit 134. To analyze signals from sensor element, state machine 136 can use transformation in the frequency domain, stimulation with different frequencies or some other suitable method.

Figure 6:
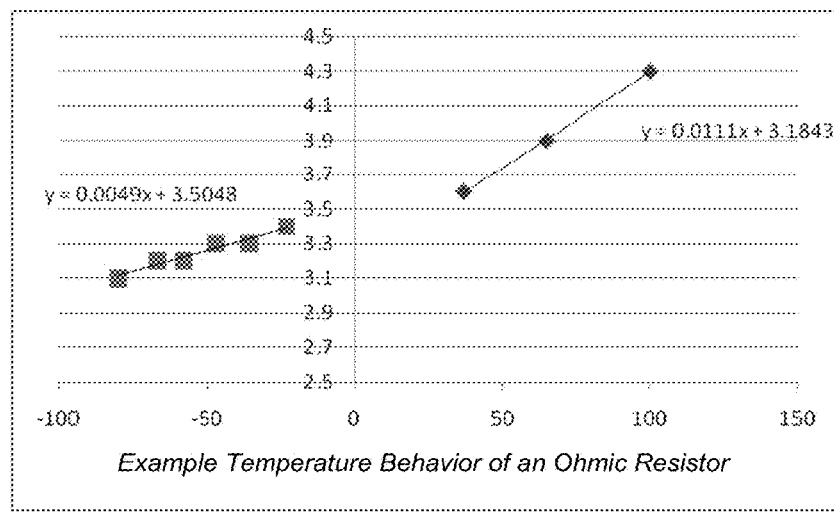
FIG. 6 is a plot of temperature coefficients of a resistor according to an embodiment.

Optional measurement circuit 138 can be configured to measure temperature based on impedance of heating element 130 and known temperature behaviors. For example, FIG. 6 depicts example temperature coefficients for a sample conductive polymer. As can be seen, there is a strong positive temperature coefficient at higher temperatures, and in embodiments this can be taken into account in order to prevent filamenting of current in heating element 130.

Returning to the embodiment of FIG. 2A, sensing and heating portion 108 can be formed by integrating sensor structure 114 with heating structure 112 and then applied or mounted in or on blades 104 or some other structure of wind turbine 100, or some other device, such as an automobile, aircraft, train or other structure. For example, sensing and heating portion 108 can be applied on edges, such as leading edges, of blades 104, or over an entire surface of each of blades 104. In another embodiment, sensing and heating portion 108 can be implemented in sections of blades 104, such as at the tip, middle portion and inside portion closest to support structure 102. This enables sensing of water or ice across all of blade 104, particularly given that icing conditions can vary along the length of blade 104 because of rotation speed, wind conditions and structure. A multiplexed readout of sensor structures 114 by a central state machine and/or control of sensing and heating portion 108, however distributed along blade 104, can take into account the different icing conditions that can occur at different locations. For example, in an embodiment system 106 on a single wind turbine 100 can comprise multiple instances of sensing and heating portion 108 distributed along one or more blades 104. If icing is detected only in particular areas, e.g., the tip of one blade 104, only the heating structure 112 located in that area can be activated in order to provide deicing in one embodiment. This can save energy as compared with systems which are either on or off and therefore provide heat to deice areas not experiencing icing when any icing is detected. In these and other embodiments, sensing and heating portion 108 can be modular, coupled with a single instance of circuitry 100 or some other control unit configured to interface with system 106 to read out signals and control heating and sensing.

Embodiments can be used in applications other than wind turbines. For example, the systems and methods discussed herein can be used in various avionics, train/automobile, automotive, transportation, commercial, residential and industrial applications, among others. For example, system 106 can be embedded in automotive dashboards or other areas to provide heat when certain temperatures, rather than ice, are detected. System 106 could also be used on interior or exterior areas of automobiles or aircraft to provide icing or water detection, removal and/or prevention, such as on LED and other lighting elements, antennas and other communications devices, or windshield wipers, for example. Another application relates to trains, such as radar systems used for, e.g., speed determination and monitoring, and system 106 can be used in or on radar domes or other elements, which often are located externally and underneath a train car, locomotive or other portion, to provide icing or water detection, removal and/or prevention. Other embodiments can be used in residential applications to remove or prevent formation of ice in problematic areas, such as roof edges, pedestrian areas and others. Myriad additional applications are possible in virtually any situation in which detection, removal and/or prevention of ice or water is desired.

Thus, in an embodiment, a sensing and heating system comprises a first element and a second element; and circuitry coupled to the first and second elements and configured to receive a signal from at least one of the first or second elements related to a characteristic, to analyze the signal to detect a condition, and to activate at least one of the first and second elements to provide heat if the signal is indicative of the condition. The condition can be one of water or icing. At least one of the first and second elements can be electrically conductive. At least one of the first and second elements can comprise a conductive polymer, a sputtered metal, a wire, a coating or a thin film. The signal can be spectrally analyzed to detect the condition. The first and second elements can form a capacitor, and the characteristic can be a capacitance. The characteristic can comprise an impedance. At least one of the first or second elements can comprise a resistor, and the characteristic can comprise a resistance. The circuitry can be configured to periodically sample at least one of the first and second elements to receive the signal. The first and second elements can be at least partially integrated with one another. The first element can be used as a heating element to provide the heat and the second element can be used as a sensing element to sense the characteristic. The first and second elements can be used as heating and sensing elements to provide the heat and to sense the characteristic. At least one of the first or second elements can comprise a heating and sensing element to provide the heat and to sense the characteristic. The circuitry can be configured to suspend heating by the at least one of the first or second elements to sample the at least one of the first and second elements for the sensing of the characteristic. The sensing and heating system can be configured for at least one of a wind turbine application, an avionics application or an automotive application.

In an embodiment, a wind turbine comprises at least one sensing and heating system comprising a structure configured to sense a characteristic and provide heat; and circuitry coupled to the at least one sensing and heating system and configured to receive a signal related to the characteristic, to analyze the signal, and to provide heat in an area of the wind turbine proximate the sensed characteristic if the analyzing is indicative of a condition. The at least one sensing and heating system can be mounted to the wind turbine. The at least one sensing and heating system can be mounted to a blade of the wind turbine. The condition can be icing of at least a portion of the wind turbine. The system can comprise a plurality of sensing and heating systems coupled to the circuitry, and the plurality of sensing and heating systems can be mounted at different locations on the wind turbine. The at least one sensing and heating system can comprise a first element and a second element forming a capacitor, and wherein a capacitance of the capacitor is the characteristic. At least one of the first and second elements can be configured to provide heat. The at least one sensing and heating system can comprise a heating portion at least partially integrated with a sensing portion. The structure can comprise a resistor and the characteristic comprises a resistance. The signal can be spectrally analyzed. The characteristic can be an impedance.

In an embodiment, an integrated circuit comprises driving circuitry configured to control a heating and sensing structure; and state machine circuitry coupled to the driving circuitry and configured to receive a signal from the heating and sensing structure, analyze the signal to determine a presence or absence of a condition proximate the heating and sensing structure, and control the driving circuitry based on the determined presence or absence of the condition. The condition can be icing. The state machine circuitry can be configured to control the driving circuitry by activating the driving circuitry if the presence of the condition is determined. The signal can be an impedance signal, and the state machine circuitry can be configured to analyze the signal to determine the presence or absence of the condition based on an impedance. The signal can be a capacitance signal, and the state machine circuitry can be configured to analyze the signal to determine the presence or absence of the condition based on a capacitance. The integrated circuit can further comprise temperature circuitry configured to determine a temperature of the heating and sensing element based on the signal received from the heating and sensing structure. The heating and sensing structure can comprise a first element and a second element forming a capacitor, wherein the signal includes a capacitance of the capacitor. The heating and sensing structure can comprise a first element for providing heat and a second element for sensing the condition. The second element can be configured to sense the condition in cooperation with the first element. The integrated circuit can be used in at least one of a wind turbine application, an avionics application or an automotive application.

In an embodiment, a method comprises sensing a characteristic by a sensing and heating structure; analyzing the characteristic to determine whether moisture is present at the sensing and heating structure; and activating the sensing and heating structure to provide heat if a result of the analyzing is a presence of moisture. Sensing a characteristic by a sensing and heating structure can comprise sensing a capacitance between a first element and a second element of the sensing and heating structure. Activating the sensing and heating structure can further comprise causing current to flow through at least one of the first or second elements to produce heat. Sensing a characteristic can comprise utilizing at least one of a first element and a second element of the sensing and heating structure. Activating the sensing and heating structure can further comprise causing current to flow through at least one of the first or second elements to produce heat. The method can further comprise forming the sensing and heating structure. Forming the sensing and heating structure can comprise at least one of forming a conductive polymer or sputtering a metal. The method can further comprise applying the sensing and heating structure to at least one of a wind turbine, an aircraft, or an automobile. Sensing a characteristic by a sensing and heating structure can comprise sensing an impedance by the sensing and heating structure. Sensing a characteristic by a sensing and heating structure can comprise sensing a resistance by the sensing and heating structure. Analyzing the characteristic can comprise spectrally analyzing the characteristic. The method can further comprise providing a signal related to the sensed characteristic.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensing and heating system comprising:
a first element and a second element that form a capacitor;
a switch configured to selectively connect the first and the second elements together; and
circuitry coupled to the first and second elements and configured to:
control the switch to disconnect the first element from the second element to receive a signal from at least one of the first or second elements related to a capacitance of the capacitor formed by the first and the second elements,
analyze the signal to detect a condition, and
control the switch to connect the first element to the second element together to activate the first and the second elements to provide heat if the signal is indicative of the condition.

2. The system of claim 1, wherein the condition is one of water or icing.

3. The system of claim 1, wherein at least one of the first and second elements is electrically conductive and comprises a conductive polymer.

4. The system of claim 1, wherein the signal is spectrally analyzed to detect the condition.

5. The system of claim 1, wherein the circuitry is configured to periodically sample at least one of the first and second elements to receive the signal.

6. The system of claim 1, wherein the sensing and heating system is configured for at least one of a wind turbine application, a train or railroad application, an avionics application or an automotive application.

7. An integrated circuit comprising:
driving circuitry configured to control a heating and sensing structure, the heating and sensing structure including a first element and a second element that form a capacitor;
a switch configured to selectively connect the first and the second elements together; and
state machine circuitry coupled to the driving circuitry and configured to:
control the switch to disconnect the first element from the second element to receive a capacitance signal corresponding to a capacitance of the capacitor from the heating and sensing structure, analyze the capacitance signal to determine a presence or absence of a condition proximate the heating and sensing structure, and control the switch to connect the first element to the second element together and the driving circuitry based on the determined presence or absence of the condition.

8. The integrated circuit of claim 7, wherein the condition is icing.

9. The integrated circuit of claim 7, wherein the state machine circuitry is configured to control the driving circuitry by activating the driving circuitry if the presence of the condition is determined.

10. The integrated circuit of claim 7, wherein the state machine circuitry is configured to analyze the capacitance signal to determine the presence or absence of the condition based on the capacitance of the capacitor.

11. The integrated circuit of claim 7, further comprising temperature circuitry configured to determine a temperature of the heating and sensing element based on the capacitance signal received from the heating and sensing structure.

12. The integrated circuit of claim 7, wherein the first element and the second element are configured to provide heat when connected together by the switch and the second element is configured to sense the condition based on the switch disconnecting the second element from the first element.

13. The integrated circuit of claim 12, wherein the second element is configured to sensing the condition in cooperation with the first element.

14. The integrated circuit of claim 7, wherein the integrated circuit is used in at least one of a wind turbine application, a train or railroad application, an avionics application or an automotive application.

15. A method comprising:

disconnecting first and second elements of a sensing and heating structure, the first and the second elements forming a capacitor;

sensing a capacitance between the first and the second elements of the sensing and heating structure having the first element disconnected from the second element;

analyzing the capacitance to determine whether moisture is present at the sensing and heating structure;

connecting the first element to the second element; and activating the connected first and second elements of the sensing and heating structure to provide heat if a result of the analyzing is a presence of moisture.

16. The method of claim 15, wherein sensing the capacitance comprises utilizing at least one of the first element and the second element of the sensing and heating structure.

17. The method of claim 15, further comprising applying the sensing and heating structure to at least one of a wind turbine, a train, an aircraft, or an automobile.

18. The method of claim 15, further comprising:

sensing at least one of an impedance or a resistance by the sensing and heating structure; and analyzing the at least one of an impedance or a resistance to determine whether moisture is present at the sensing and heating structure.

* * * * *